(12) United States Patent
Nagatomo et al.

(10) Patent No.: US 7,817,421 B2
(45) Date of Patent: Oct. 19, 2010

(54) MOTOR CONTROLLER

(75) Inventors: Shigekatsu Nagatomo, Kitakyushu (JP); Koji Nuki, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 33 days.

(21) Appl. No.: 12/440,169

(22) PCT Filed: Aug. 24, 2007

(86) PCT No.: PCT/JP2007/066420
§ 371 (c)(1), (2), (4) Date: Mar. 5, 2009

(87) PCT Pub. No.: WO2008/032542
PCT Pub. Date: Mar. 20, 2008

(65) Prior Publication Data
US 2009/0244845 A1 Oct. 1, 2009

(30) Foreign Application Priority Data
Sep. 13, 2006 (JP) .............................. 2006-248199
Jan. 18, 2007 (JP) .............................. 2007-008925

(51) Int. Cl.
*H05K 7/20* (2006.01)
(52) U.S. Cl. .................. 361/697; 361/696; 361/679.48; 361/679.54; 165/80.3; 165/121; 165/104.33
(58) Field of Classification Search ............ 361/679.46, 361/679.47, 679.48, 679.54, 690–697, 704, 361/712, 715, 717, 719, 722, 728, 736, 748, 361/752, 760, 761, 767; 165/80.3, 104.33, 165/104.34, 121, 185; 257/706–727, E23.082, 257/E23.084, E23.099, E23.086; 174/15.1, 174/16.3, 252; 310/12, 13, 14, 68 R, 53, 310/62, 63; 363/137, 144, 146, 141, 147; 318/778, 370, 376, 135, 701
See application file for complete search history.

(56) References Cited
U.S. PATENT DOCUMENTS
5,610,492 A * 3/1997 Leung et al. ................. 318/701
(Continued)

FOREIGN PATENT DOCUMENTS
JP        7-26668 U        5/1995
(Continued)

*Primary Examiner*—Michael V Datskovskiy
(74) *Attorney, Agent, or Firm*—Sughrue Mion, PLLC (57) ABSTRACT

A motor controller capable of relaxing the temperature of a heat source which generates heat by driving the motor controller, and capable of realizing miniaturization and low price is provided. In a motor controller in which a power semiconductor module (2) which closely contact a heat sink (1) is mounted on a substrate (4), and a fan (6) is attached to the heat sink (1) by a fan case (8), portions of fins (1g) of the heat sink (1) are formed with a bell mouth (1c) and a circular-arc-shaped guide (1h), and the radiating capability of the fins (1g) is improved by effectively using the wind of the fan (6).

8 Claims, 6 Drawing Sheets

U.S. PATENT DOCUMENTS

| | | | | |
|---|---|---|---|---|
| 5,774,353 A | * | 6/1998 | Wieloch | 363/146 |
| 5,909,358 A | * | 6/1999 | Bradt | 361/707 |
| 5,930,112 A | * | 7/1999 | Babinski et al. | 361/695 |
| 6,021,260 A | * | 2/2000 | Katahira | 358/1.16 |
| 6,087,800 A | * | 7/2000 | Becker et al. | 318/778 |
| 6,856,503 B2 | * | 2/2005 | Apfelbacher et al. | 361/676 |
| 6,900,562 B2 | * | 5/2005 | Derksen | 310/68 R |
| 7,148,452 B2 | * | 12/2006 | Peterson et al. | 219/443.1 |
| 7,315,450 B2 | * | 1/2008 | Ishii et al. | 361/704 |

FOREIGN PATENT DOCUMENTS

| | | | |
|---|---|---|---|
| JP | 09065661 A | * | 3/1997 |
| JP | 11-340665 A | | 12/1999 |
| JP | 2003-017883 A | | 1/2003 |
| JP | 2003-282803 A | | 10/2003 |
| JP | 2004-235654 A | | 8/2004 |
| JP | 2004-349548 A | | 12/2004 |

* cited by examiner

MOTOR CONTROLLER

TECHNICAL FIELD

The present invention relates to a motor controller, such as an inverter device or a servo amplifier, which operates mainly by a high-voltage power supply, and particularly, to a heat sink for enhancing the radiating effect of a motor controller.

RELATED ART

Since a power semiconductor module which emits high heat is used in a conventional motor controller, for example, an inverter device, a cooling effect is raised by brining the power semiconductor module into close contact with a heat sink. Furthermore, in order to raise the cooling effect, the cooling effect is raised by forced air cooling using a fan (for example, refer to Patent Document 1).

Figure 4:
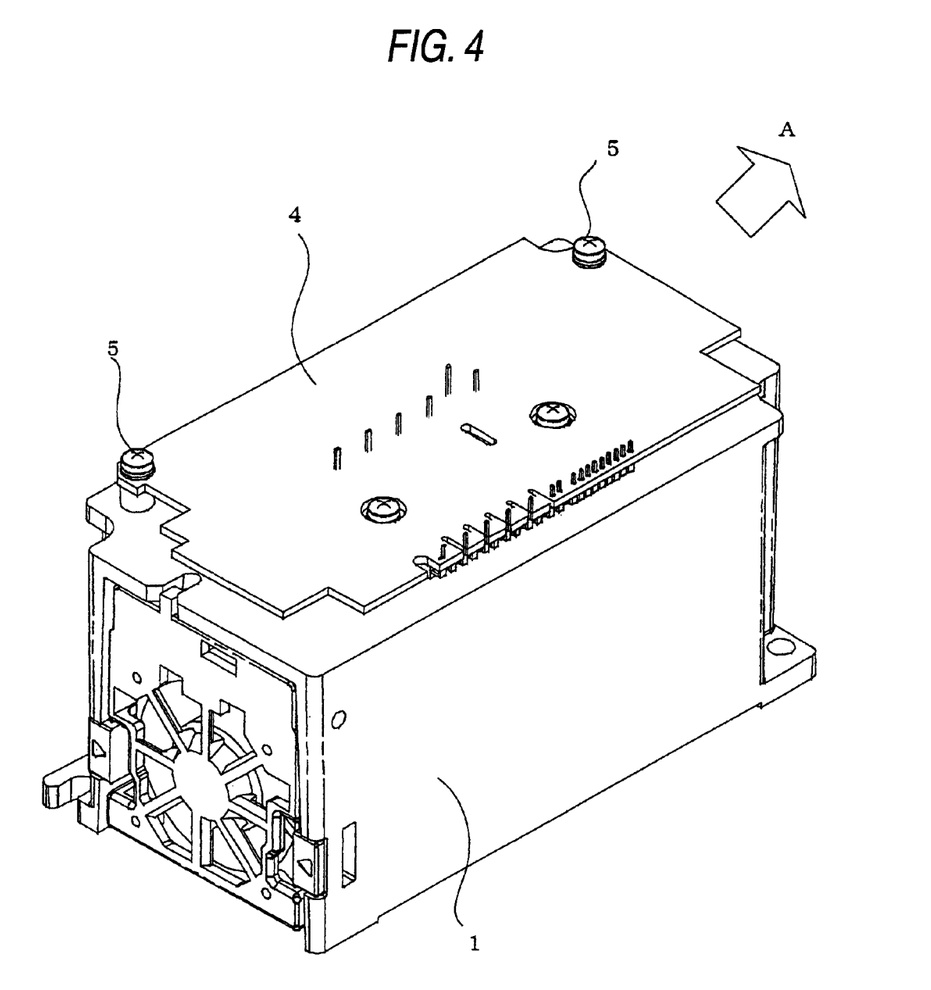
FIG. 4 is a perspective view showing a motor controller in a conventional technique.
Figure 5:
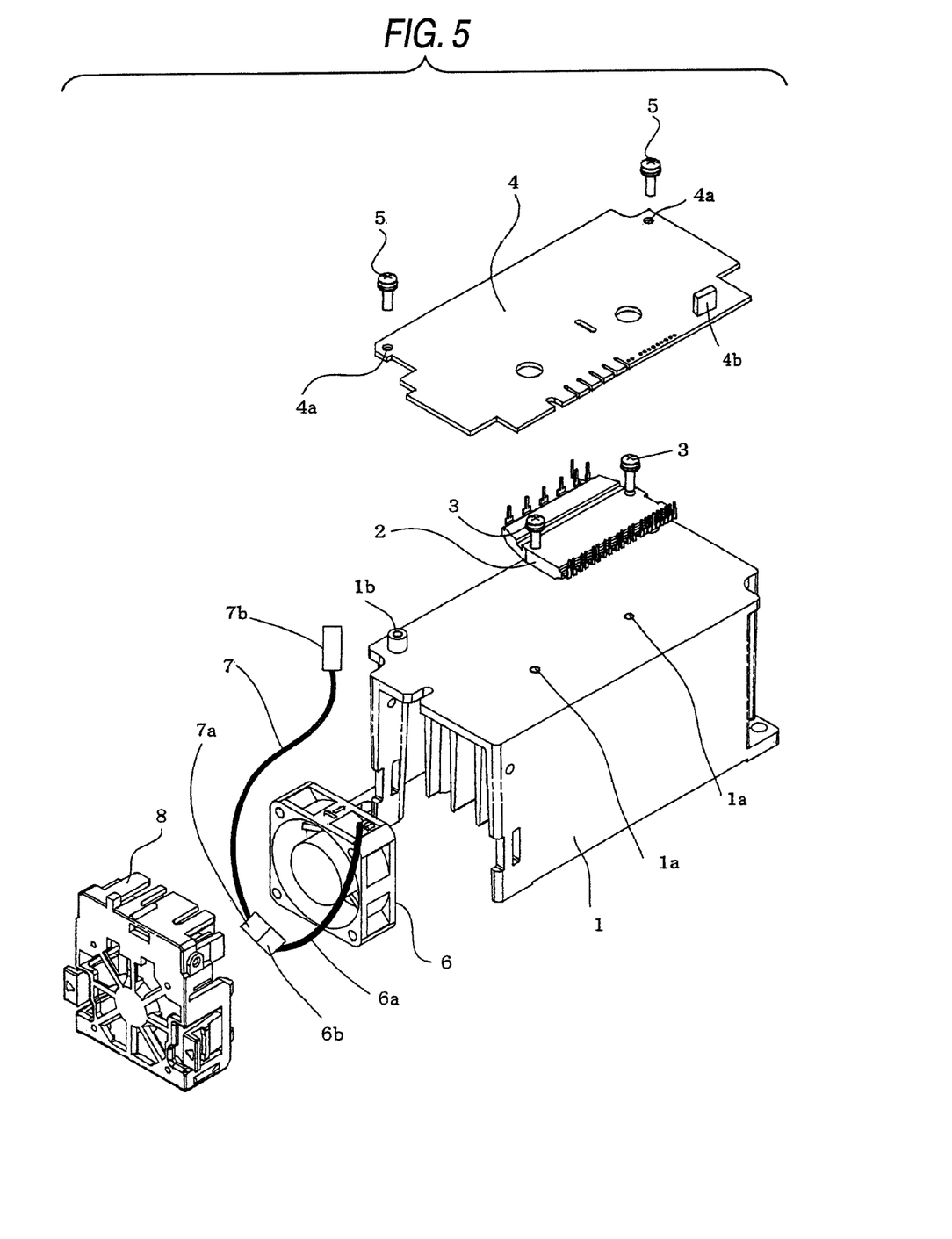
FIG. 5 is an exploded perspective view of the motor controller in FIG. 4.
Figure 6:
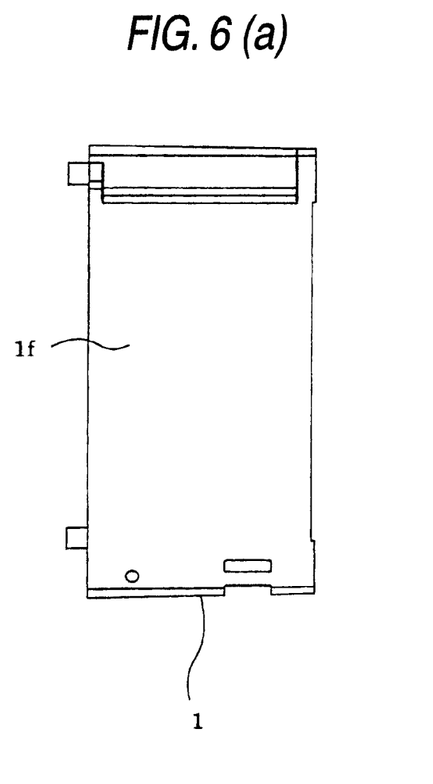

In a conventional motor controller, for example, an inverter device, the configuration shown in FIGS. 4, 5, and 6 has been adopted. In FIGS. 4 to 6, a substrate 4 is attached to a heat sink 1, for example, by screwing screws 5 into screw holes 1*b* provided in the heat sink 1. A power semiconductor module 2 including inverter portion IGBT (Insulated Gate Bipolar Transistor) elements, etc. is mounted on the heat sink 1 on the lower face of a substrate 4. In addition, the power semiconductor module 2 is brought into close contact with and attached to the upper face of the heat sink 1 with screws 3. A fan case 8 to which a fan 6, a cable 6*a*, a connector 6*b*, a cable 7, and a connector 7*a* are attached is attached to the ground side of the heat sink 1. In addition, a connector 7*b* is connected to the connector 4*b*.

In the heat sink 1 of FIG. 6 in this configuration, the middle of the heat sink is provided with fin 1*g*, and both side faces thereof is provided with side plates 1*f*, and the fins 1*g* and the side plates 1*f* are formed vertically on the ceiling side. The fins 1*g* on the ground side are made short in order to attach the fan case 8 to which the fan 6 is attached. The heat sink 1 is molded by die casting in order to form a complicated shape.

Patent Document 1: JP-A-2004-349548

DISCLOSURE OF THE INVENTION

Problems to be Solved by the Invention

However, the heat sink to be used for the conventional motor controller had the following problems.

(1) It is necessary to adopt a heat sink with the heat radiation capability for radiating the heat of a power semiconductor module, and a heat sink having a certain fixed heat radiating area (size) is required.

(2) When the heat radiating area by natural air cooling is insufficient, a fan having certain fixed wind speed and air volume is required in order to create forced air flow.

(3) Since the flow of air is bad in the fins of the heat sink at both ends of the fan, all the corners of the heat sink can not be used effectively. Therefore, it is necessary to adopt a fan with high wind speed and air volume. Since the fan with high wind speed and air volume has large power consumption, the configuration of a power supply circuit becomes large, and the configuration of the substrate of the motor controller becomes large. Further, in the fan with high wind speed and air volume, the configuration of the fan itself becomes large, and the appearance thereof becomes large. Therefore, there are limitations in realizing miniaturization of the motor controller.

(4) When the fan with high wind speed and air volume is adopted, the number of parts and material cost of the fan itself increases, and a cost increase is caused. Further, since the number of parts of the substrate of the motor controller increases, a cost increase is caused. Therefore, there are limitations in realizing cost reduction of the motor controller.

(5) When a fan is attached during at a manufacturing process or fan replacement, there is a probability that the fan is attached erroneously such that the direction of wind of the fan becomes a reverse direction. If the direction of wind of the fan is a reverse direction, the cooling performance is lower than that when the wind direction is right, and the quality the motor controller deteriorates.

The invention has been made in view of such problems, and an object of the invention is to provide a motor controller capable of easily miniaturizing the device, reducing the cost of parts, and achieving cost reduction.

Means for Solving the Problems

In order to solve the above problem, the invention is constructed as follows.

According to the invention of claim 1, there is provided a motor controller including:

a heat sink having fins, a power semiconductor module having a plurality of external electrode terminals which closely contact the heat sink, a substrate to which the plurality of external electrode terminals are connected, a fan having a connecting cable attached to the heat sink, a cable for connecting the connecting cable of the fan with the substrate, and a fan case for fixing the fan and the heat sink together, wherein a fan placing portion is formed in a fin portion of the heat sink so that the fan is placed thereon.

According to the invention of claim 2, there is provided the motor controller, characterized in that the fan placing portion is constituted from a plurality of bosses provided on the heat sink.

According to the invention of claim 3, there is provided the motor controller, characterized in that a bell mouth is formed at a fin portion of the heat sink on which the fan is placed directly.

According to the invention of claim 4, there is provided the motor controller, characterized in that a guide is formed between the bell mouth and side plates of the heat sink by a gentle circle arc.

According to the invention of claim 5, there is provided the motor controller, characterized in that ends of the fins on the side of the bell mouth of the heat sink are made short in accordance with the circular-arc inclination of the guide.

According to the invention of claim 6, there is provided the motor controller, characterized in that a mechanism for holding a cable is formed at a fin portion of the heat sink on which the fan is placed directly.

According to the invention of claim 7, there is provided the motor controller, characterized in that a projection which restrains the attachment direction of the fan in one direction is formed at the fin portion where the fan of the heat sink is placed directly, and a recess which is engaged with the projection is formed at a placing face of the fan.

According to the invention of claim 8, there is provided the motor controller, characterized in that the recess is a cutout formed in a side portion of the fan.

Effects of the Invention

According to the invention, there are the following advantages.

According to the inventions of claims 1 and 2, the fan is directly placed on the heat sink. Therefore, wiring routing of the cable can be simplified, and replacement thereof can be performed easily. As a result, replacement by a customer can be performed easily, and an improvement in maintenance can be performed.

According to the inventions of claims 3 and 4, air progresses along a fin shape of the heat sink, and sufficient flow velocity is generated. Therefore, the heat radiation capability of the fins of the heat sink can be improved, and the heat sink can be miniaturized. Further, since air passes through the fan surely and is exhausted, the flow of the air is equalized, and the fan is used efficiently. Therefore, the fan with minimum wind speed and air volume can be adopted, and the substrate of the motor controller and the fan can be miniaturized. The motor controller is miniaturized by the miniaturization of the heat sink, the miniaturization of the substrate of the motor controller, and the miniaturization of the fan. By the miniaturization of the heat sink, the miniaturization of the substrate of the motor controller, and the miniaturization of the fan, the material cost of the heat sink, the cost of parts of the substrate of the motor controller and the cost of parts of the fan can be suppressed, and the cost of the motor controller can be reduced.

According to the invention of claim 4, since wind progresses along the fin shape of the heat sink, wind stagnation disappears, and noises decrease, so that the quality of the motor controller can be improved.

According to the invention of claim 5, the distance between the fan and the fins which optimizes the wind speed and air volume of the fan can be secured, and the fan with minimum wind speed and air volume can be adopted.

Since the fan with minimum wind speed and air volume can be employed, the substrate of the motor controller and the fan can be miniaturized, and the motor controller can be miniaturized. Further, the cost of parts of the substrate of the motor controller and the cost of parts of the fan can be suppressed, and the cost of the motor controller can be reduced.

According to the invention of claim 6, wiring routing of the cable can be simplified and the replacement can be performed easily. As a result, replacement by a customer can be performed easily and an improvement in maintenance can be performed.

According to the inventions of claims 7 and 8, the attachment direction of the fan can be prevented from being mistaken during assembling operation. As a result, the efficiency of the operation can be enhanced, and the deterioration of quality can be prevented.

BRIEF DESCRIPTION OF THE DRAWINGS

FIGS. 3(a) to 3(d) are views showing a heat sink of the motor controller in FIG. 1.

FIGS. 6(a) to 6(c) are views showing a heat sink of the motor controller in FIG. 5, and, FIG. 6(a) is a right side view, FIG. 6(b) is a rear view, and FIG. 6(c) is a plan view.

DESCRIPTION OF REFERENCE NUMERALS AND SIGNS

1: HEAT SINK
1a: SCREW HOLE
1b: SCREW HOLE
1c: BELL MOUTH
1d: BOSS
1e: SUPPORT
1f: SIDE PLATE
1g: FIN
1h: GUIDE
1i: PROJECTION
2: POWER SEMICONDUCTOR MODULE
3: POWER SEMICONDUCTOR MODULE FIXING SCREW
4: SUBSTRATE
4a: SCREW THROUGH HOLE
4b: CONNECTOR
5: SUBSTRATE FIXING SCREW
6: FAN
6a: CABLE
6b: CONNECTOR
6c: HOLE
6d: CUTOUT
7: CABLE
7a: CONNECTOR
7b: CONNECTOR
8: FAN CASE
A: CEILING SIDE

BEST MODE FOR CARRYING OUT THE INVENTION

Hereinafter, preferred embodiments of the invention will be described with reference to the accompanying drawings.

Embodiment

Figure 1:
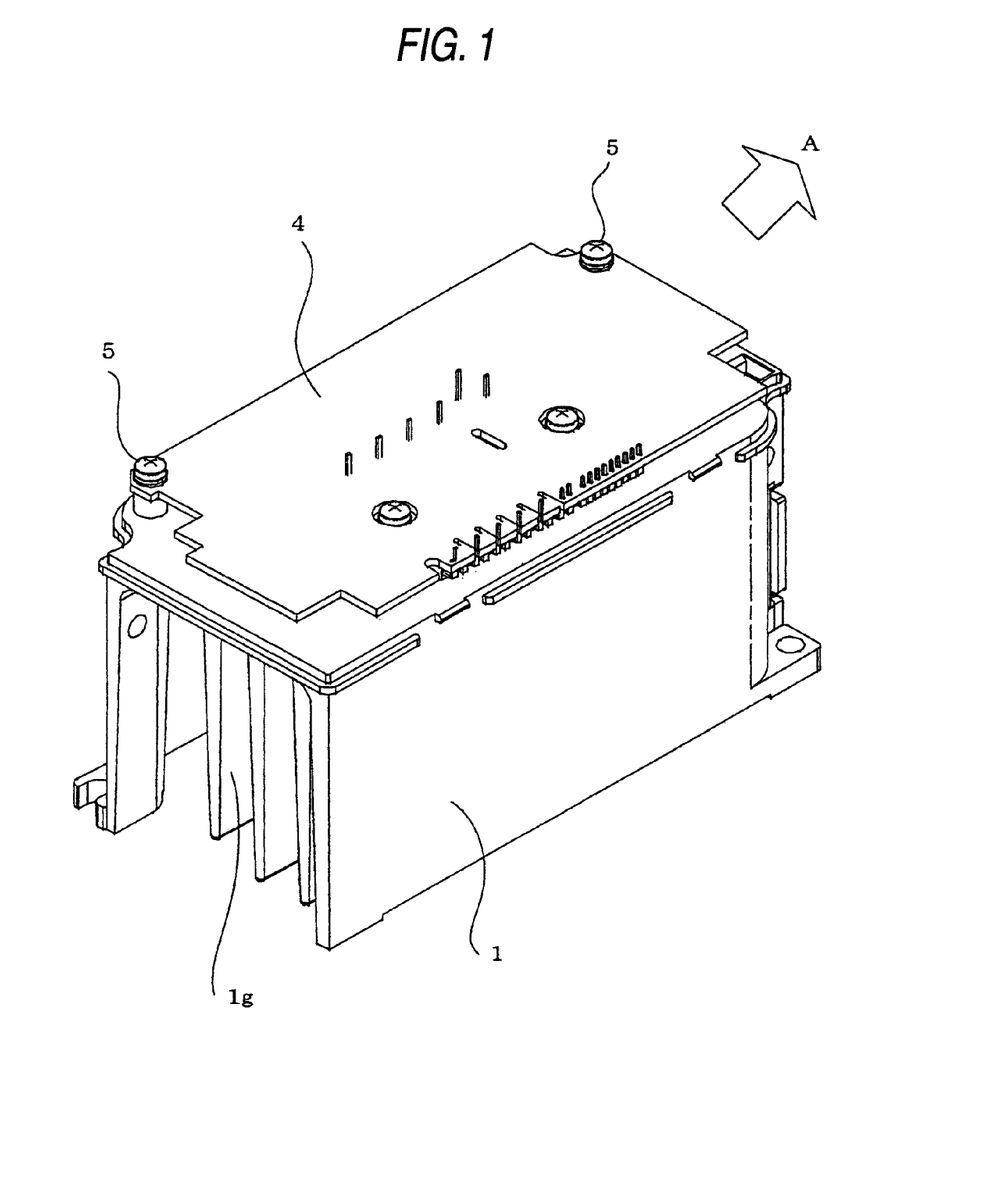
FIG. 1 is a perspective view showing a motor controller in an embodiment of the invention.
Figure 2:
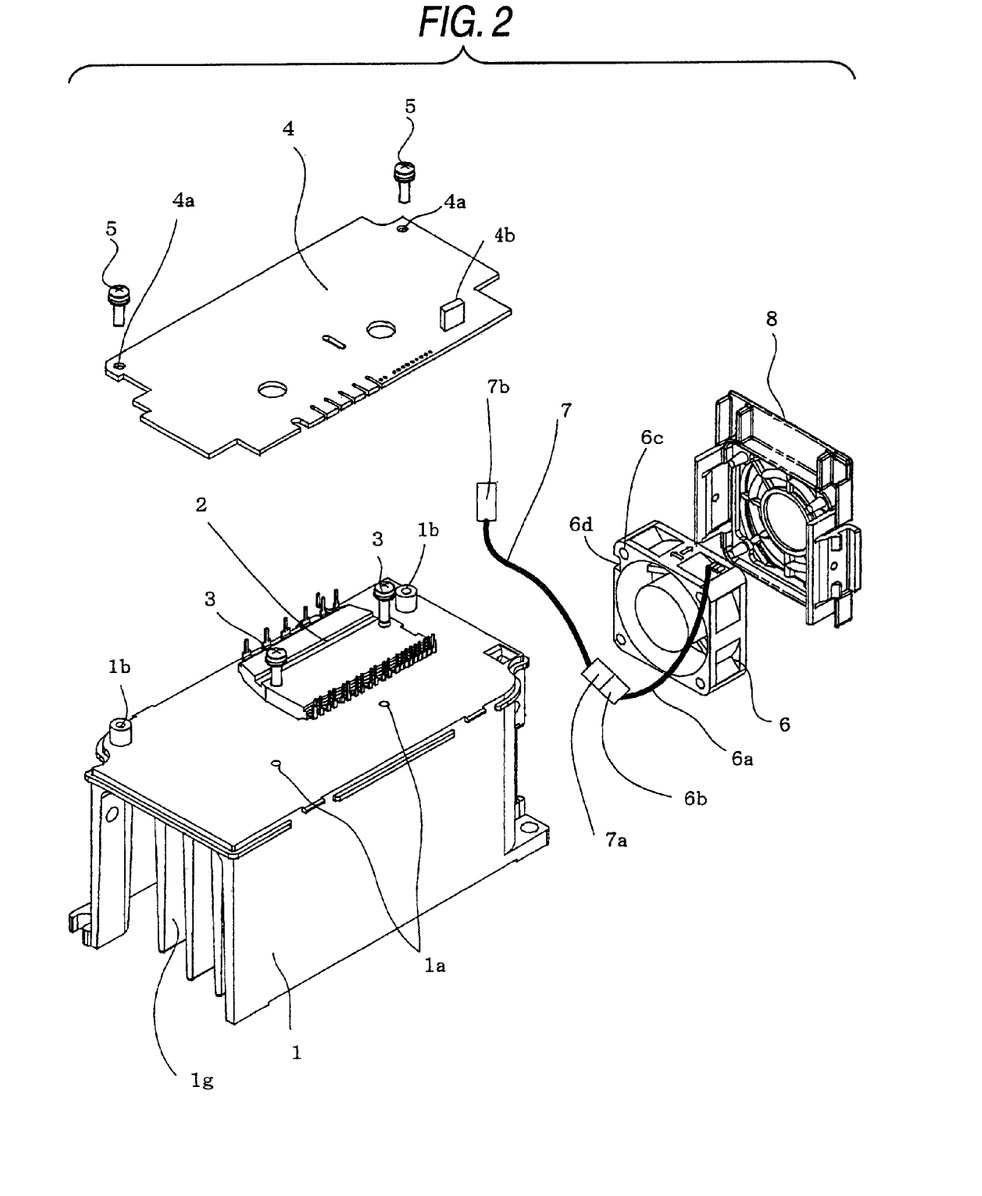
FIG. 2 is an exploded perspective view of the motor controller in FIG. 1.

FIG. 1 is a perspective view showing a motor controller in an embodiment of the invention. FIG. 2 is an exploded perspective view of the motor controller in FIG. 1. FIGS. 3(a) to 3(d) are views showing a heat sink of the motor controller in FIG. 1, and FIG. 3(a) is a perspective view as seen from the ceiling side (upper side), FIG. 3(b) is a bottom view as seen from the side (bottom side) opposite to the ceiling side, FIG. 3(c) is a right side view, and FIG. 3(b) is a rear view as seen from the side opposite to the side where a substrate is placed.

Figure 3:
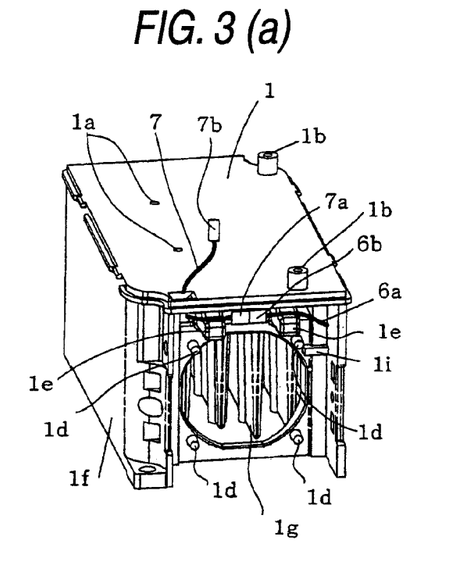
FIG. 3(a) is a perspective view as seen from the ceiling side.
FIG. 3(b) is a bottom view as seen from the side (bottom side) opposite to the ceiling side.
FIG. 3(c) is a right side view.
FIG. 3(d) is a rear view as seen from the side opposite to the side where a substrate is placed.

In FIGS. 1 to 3, reference numeral 1 represents a heat sink, and reference numeral 2 represents a power semiconductor module, including inverter portion IGBT elements, etc., which is structured to have a plurality of external electrode terminals. Reference numeral 4 represents a first substrate to which the external electrode terminals of the power semiconductor module 2 are connected. Reference numeral 6 represents a fan having cables and connectors. Reference numeral 7 represents a cable which connects the substrate 4 with the fan 6. Reference numeral 8 represents a fan case which fixes the fan 6 to the heat sink 1.

The heat sink 1 is formed in the shape of, for example, a rectangular parallelepiped, and the front face (a face where a substrate is placed) thereof is formed in a planar shape, and is formed with a plurality of screw holes 1a for attaching the power semiconductor module 2 to the heat sink 1.

Further, a plurality of screw holes 1b for attaching to the heat sink 1 the substrate 4 to which the external electrode terminals are connected are formed.

A bell mouth 1c and a plurality of bosses 1d and supports 1e for attaching the fan 6, a cable 6a, a connector 6b, the cable 7, and a connector 7a are formed in an upper portion on the rear side. A placing portion of the fan 6 is constituted from the bosses 1d of the heat sink 1, and the bosses 1d are fitted into holes 6c provided in a placing face of the fan 6.

Further, the portions of fins 1g where the fan 6 of the heat sink 1 is placed directly is formed with a projection 1i which restrains the attachment direction of the fan 6 in one direction, and a placing face of the fan 6 is formed with a recess, for example, a cutout 6d which is engaged with the projection 1i. When the fan 6 is placed on heat sink 1, the holes 6c of the fan are fitted on the bosses 1d of the heat sink 1, and the projection 1i of the heat sink 1 is engaged the cutout 6d of the fan 6 to establish correct attachment.

Further, side plates 1f, the fins 1g, and a guide 1h which is formed between the bell mouth 1c and the side plates 1f by a gentle circular arc are formed on both side faces substantially from a central portion to a lower portion on the rear side.

The power semiconductor module 2 is arranged on the screw holes 1a of the heat sink 1, and is temporarily fixed using screws 3.

The substrate 4 is arranged on the screw holes 1b of the heat sink 1, and is fixed by fastening screws 5 to the screw holes 1b through screw through holes 4a of the substrate 4. The power semiconductor module 2 is also fastened and fixed. In this state, the terminals of the power semiconductor module 2 are soldered to the substrate 4.

The fan 6 is placed on the bosses 1d of the heat sink 1 which constitute a fan placing portion. In that case, the cutout 6d of the fan 6 is placed so as to fit to projection 1i of the heat sink 1. The cable 6a, the connector 6b, the cable 7, and the connector 7a are arranged on the supports 1e of the heat sink 1, and are fixed to the heat sink 1 by the fan case 8. In addition, a connector 7b is attached to a connector 4b of the substrate 4.

In the motor controller of the invention, the fin portion bell mouth 1c and the guide 1h of the heat sink 1 are formed. Thus, air progresses along a fin shape of the bell mouth 1c and the guide 1h by the suction of fan 6, thereby generating sufficient flow velocity. Therefore, the heat radiation capability of the fins of the heat sink 1 can be improved, and the heat sink 1 is miniaturized. Moreover, by virtue of the fin shape of the heat sink 1, the flow of air is equalized and the fan 6 is used efficiently. Therefore, the fan 6 with minimum wind speed and air volume can be adopted, and the substrate of the motor controller and the fan 6 can be miniaturized. The motor controller is miniaturized by the miniaturization of the heat sink 1, the miniaturization of the substrate of the motor controller, and the miniaturization of the fan 6.

Further, by optimal adoption of the fan 6, the cost of parts of the substrate of the motor controller and the cost of parts of the fan 6 can be suppressed, and the cost of the motor controller can be reduced.

Moreover, since wind progresses along the fin shape of the heat sink 1, wind stagnation disappears, and noises decrease, so that the quality of the motor controller can be improved. Further, since the bosses 1d and the supports 1e allows the fan 6 to be directly placed on the heat sink 1, wiring routing of the cable 6 can be simplified, and replacement thereof can be performed easily. Since the replacement can be performed easily, replacement by a customer can be performed easily, and an improvement in maintenance can be performed.

Further, the fan 6 can always be placed in a right direction by fitting the cutout 6d of the fan 6 and the projection 1i of the heat sink 1. When an attempt to place the fan 6 in an opposite direction is made, the fan cannot be placed because the fan 6 floats by the projection 1i. Therefore, erroneous attachment of the fan is avoided, and the quality of the motor controller can be improved.

INDUSTRIAL APPLICABILITY

The invention relates to a motor controller, such as an inverter device or a servo amplifier, which operates mainly by a high-voltage power supply, and particularly, to a heat sink for enhancing the radiating effect of a motor controller. This heat sink can be utilized in a field where a motor controller capable of easily miniaturizing the device, reducing the cost of parts, and achieving cost reduction is manufactured and provided.

The invention claimed is:

1. A motor controller comprising:
    a heat sink having fins,
    a power semiconductor module having a plurality of external electrode terminals which closely contact the heat sink,
    a substrate to which the plurality of external electrode terminals are connected,
    a fan having a connecting cable attached to the heat sink,
    a cable for connecting the connecting cable of the fan with the substrate, and
    a fan case for fixing the fan and the heat sink together, wherein
    a fan placing portion is formed in a fin portion of the heat sink so that the fan is placed thereon.

2. The motor controller according to claim 1, wherein the fan placing portion is constituted from bosses provided on the heat sink.

3. The motor controller according to claim 1, wherein a bell mouth is formed at a fin portion on which the fan is placed.

4. The motor controller according to claim 1, wherein a guide is formed between the bell mouth and side plates by a gentle circle arc.

5. The motor controller according to claim 1, wherein ends of the fins on the side of the bell mouth of the heat sink are made short in accordance with the circular-arc inclination of the guide.

6. The motor controller according to claim 1, wherein a cable holding portion is formed at the fin portion on which the fan of the heat sink is placed directly.

7. The motor controller according to claim 1, wherein a projection which restrains the attachment direction of the fan in one direction is formed at the fin portion where the fan of the heat sink is placed directly, and a recess which is engaged with the projection is formed at a placing face of the fan.

8. The motor controller according to claim 7, wherein the recess is a cutout formed in a side portion of the fan.

* * * * *